(12) United States Patent
Griffin

(10) Patent No.: US 11,152,804 B2
(45) Date of Patent: Oct. 19, 2021

(54) CIRCUIT AND METHOD FOR DETECTING STATUS OF A DC POWER SUPPLY FOR CHARGING A BATTERY

(71) Applicant: RR Solutions LLC, Tennyson, IN (US)

(72) Inventor: Daniel Wayne Griffin, Tennyson, IN (US)

(73) Assignee: RR Solutions LLC, Tennyson, IN (US)

( * ) Notice: Subject to any disclaimer, the term of this patent is extended or adjusted under 35 U.S.C. 154(b) by 707 days.

(21) Appl. No.: 16/028,871

(22) Filed: Jul. 6, 2018

(65) Prior Publication Data

US 2020/0014227 A1 Jan. 9, 2020

(51) Int. Cl.
*H02J 7/00* (2006.01)
*G01R 31/40* (2020.01)

(52) U.S. Cl.
CPC ............ *H02J 7/0047* (2013.01); *G01R 31/40* (2013.01); *H02J 7/0068* (2013.01)

(58) Field of Classification Search
None
See application file for complete search history.

(56) References Cited

U.S. PATENT DOCUMENTS

| | | | |
|---|---|---|---|
| 5,365,145 A | 11/1994 | Fields | |
| 5,566,166 A * | 10/1996 | Lee | H04Q 11/0442 370/282 |
| 5,739,639 A | 4/1998 | Johnson | |
| 5,955,843 A | 9/1999 | Nuckolls et al. | |
| 6,583,571 B1 | 6/2003 | Wang | |
| 2008/0024010 A1 | 1/2008 | Romano | |
| 2009/0256576 A1 * | 10/2009 | Weems, II | G01R 31/08 324/520 |
| 2012/0124418 A1 * | 5/2012 | Liu | G06F 11/0709 714/14 |
| 2013/0147269 A1 | 6/2013 | Zimmermann et al. | |
| 2015/0155743 A1 | 6/2015 | Noguchi | |
| 2015/0192630 A1 * | 7/2015 | Tsukamoto | G01R 31/382 324/426 |
| 2016/0377246 A1 | 12/2016 | Simmons | |
| 2017/0110905 A1 | 4/2017 | Simmet et al. | |

FOREIGN PATENT DOCUMENTS

| | | |
|---|---|---|
| WO | 2010139385 A2 | 12/2010 |
| WO | 2017121653 A1 | 7/2017 |

* cited by examiner

*Primary Examiner* — Jay Patidar
*Assistant Examiner* — Haidong Zhang
(74) *Attorney, Agent, or Firm* — Armstrong Teasdale LLP

(57) ABSTRACT

A status monitor circuit for detecting the status of a DC power supply for charging a battery is provided. The status monitor circuit includes a DC bus and a failure indicator circuit. The DC bus is coupled between the DC power supply and the battery. The failure indicator circuit is configured to detect a DC voltage generated by the DC power supply on the DC bus. The failure indicator circuit includes a failure indicator and a relay configured to activate the failure indicator when the DC voltage is below a failure threshold voltage.

20 Claims, 4 Drawing Sheets

CIRCUIT AND METHOD FOR DETECTING STATUS OF A DC POWER SUPPLY FOR CHARGING A BATTERY

FIELD

The field of the disclosure relates generally to electrical systems having a backup battery and, more specifically, circuits and methods for detecting status of a direct current (DC) power supply for charging the battery.

BACKGROUND

At least some known electrical systems utilize an alternating current (AC) power source, such as, for example, an AC electrical grid, as well as a backup power supply, such as, for example, a battery or bank of batteries. Such electrical systems operate a backup power supply during an AC power source failure to enable continuous operation of the system's load. At least some electrical systems also include an indicator of the status of the AC power source to alert users to an AC power failure. Some electrical systems may also include an indicator of when the load is running off the backup power supply, which would similarly alert a user to an AC power failure.

At least some electrical systems include a DC charging circuit that is powered by the AC power source. The AC power is converted to DC power that is then used, for example, to charge a battery. However, if the DC power supply fails while AC power is supplied, the AC power failure indicator is not activated.

BRIEF DESCRIPTION

In one aspect a status monitor circuit includes a DC bus coupled between a DC power supply and a battery. The status monitor circuit includes a failure indicator circuit configured to detect a DC voltage generated by the DC power supply on the DC bus. The failure indicator circuit includes a failure indicator and a relay configured to activate the failure indicator when the DC voltage is below a failure threshold voltage.

In another aspect a method of detecting the status of a DC power supply for charging a battery includes detecting, by a relay, a DC voltage generated by the DC power supply on a DC bus coupled between the DC power supply and the battery. The method includes activating, by the relay, a failure indicator when the DC voltage falls below a failure threshold voltage.

In yet another aspect an electrical system includes a DC power supply, a battery, and a DC bus coupled between the DC power supply and the battery. The DC power supply is configured to be coupled to an AC power source and is further configured to generate a DC voltage. The electrical system includes a failure indicator circuit configured to detect the DC voltage generated by the DC power supply. The failure indicator circuit includes a failure indicator and a relay. The relay is configured to activate the failure indicator when the DC voltage is below a failure threshold voltage.

DETAILED DESCRIPTION

Embodiments of the status monitor circuits described herein provide an indicator that activates when a DC power supply fails. The indicator activates even when the AC power has not failed. The indicator alerts users that, for example, one or more components of the DC power supply have failed, and the backup power supply, e.g., a battery or bank of batteries, is not being charged. The status monitor circuit also includes current blocking circuits that prevent current flow from the battery to the DC power supply when the DC power supply fails, and further prevents such a current flow from deactivating the indicator. The status monitor circuit may also include a normal operation indicator that activates when the AC power and DC power supply are both operating normally.

Figure 1:
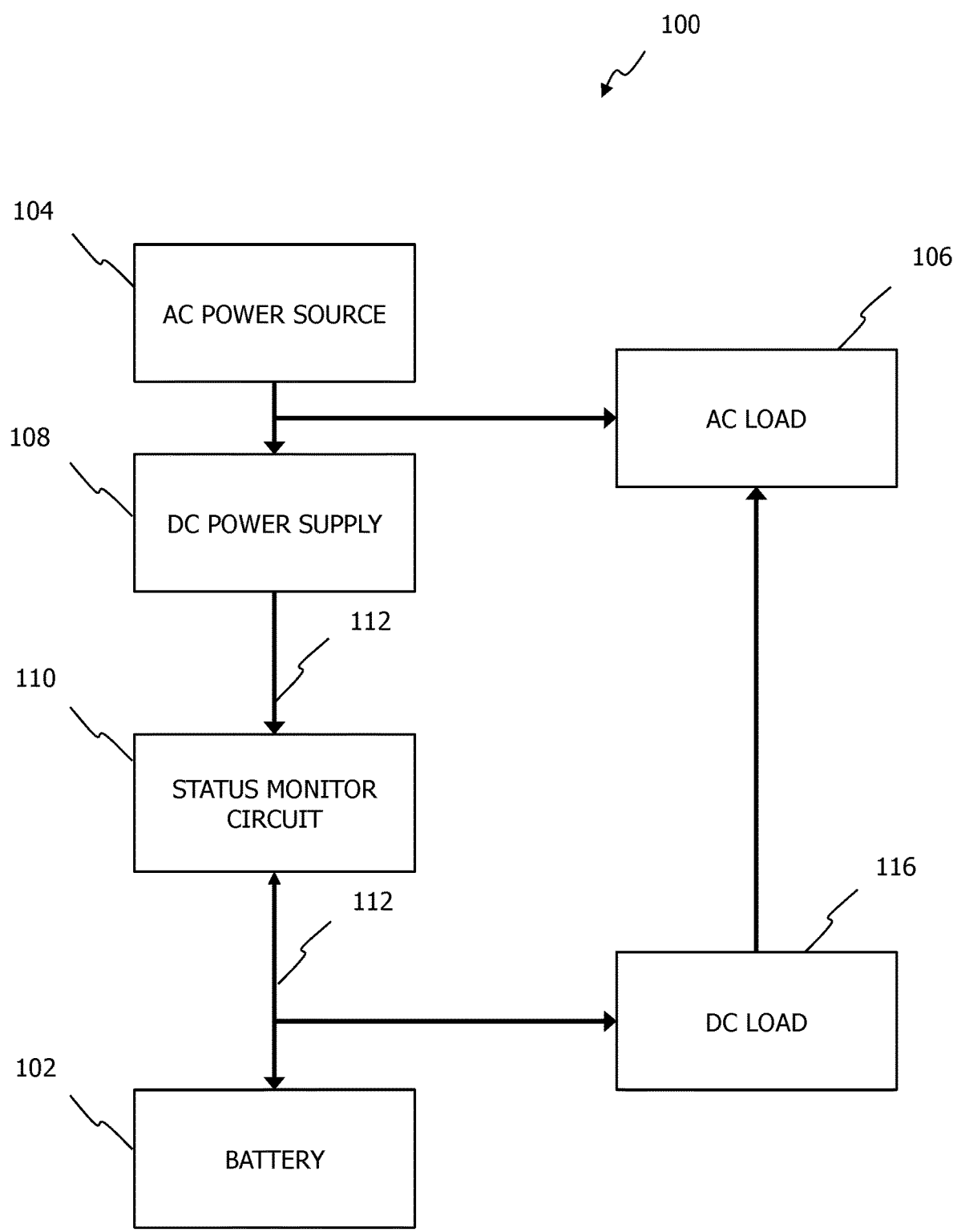
FIG. 1 is a block diagram of an example electrical system having a backup battery.

FIG. 1 is a block diagram of an example electrical system 100 having a backup battery 102. Backup battery 102 includes one or more batteries. Electrical system 100 includes an AC power source 104 that supplies AC power, for example, to an AC load 106 and a DC power supply 108. Electrical system 100 also includes a status monitor circuit 110, a DC bus, and a DC load 116.

AC power source 104 may include, for example, an AC electrical grid or an AC generator. AC generators may include, for example, a generator connected to a combustion engine, gas turbine, wind turbine, or hydro-electric plant. AC power source 104 may also include a combination of a DC power source and an inverter for converting DC power to AC power, such as, for example, a photo-voltaic, or "solar," system. AC load 106 may include an electric motor, heating element, lighting, electrical appliance, or other electrical component. In certain embodiments, for example, AC load 106 includes warning lights and gates for a railroad crossing. Railroad crossings, for public safety reasons, include various electrical loads that should continue to operate through AC power failures, i.e., a failure of AC power source 104. Railroad crossings may also include a DC load, such as DC load 116, that is supplied power through DC power supply 108 or, during an AC power failure, from battery 102.

DC power supply 108 may include, for example, an AC/DC converter, or rectifier, that converts an AC voltage signal to a DC voltage signal. The generated DC voltage is supplied to DC bus 112 that is coupled between DC power supply 108 and battery 102. DC power is supplied by DC bus 112, for example, to operate DC load 116 and to charge battery 102. DC bus 112 is coupled to and passes through status monitor circuit 110.

Status monitor circuit 110 detects the status of the DC voltage generated by DC power supply 108, regardless of whether AC power source 104 is operating normally or is failed. Status monitor circuit 110 includes a failure indicator (not shown) that activates to alert a user when the DC voltage generated by DC power supply 108 falls below a failure threshold. For example, if DC power supply 108 fails and generates zero volts on DC bus 112 when AC power source 104 is operating normally, status monitor circuit 110 activates the failure indicator in response to detecting the zero volts on DC bus 112, thereby alerting the user to the failure of DC power supply 108. In certain embodiments, electrical system 100 also includes an AC power indicator (not shown) that activates (or deactivates) to alert the user when AC power source 104 is failed. Accordingly, both the AC power and failure indicators are activated when AC power source 104 fails, because DC power supply 108 does not receive any AC power from AC power source 104. Conversely, when AC power source 104 is operating normally and DC power supply 108 fails, the AC power indicator does not indicate a failure and the failure indicator of status monitor circuit 110 is activated and indicates a failure of DC power supply 108.

In other embodiments, electrical system 100 may include additional, fewer, or alternative components, including those described elsewhere herein.

Figure 2:
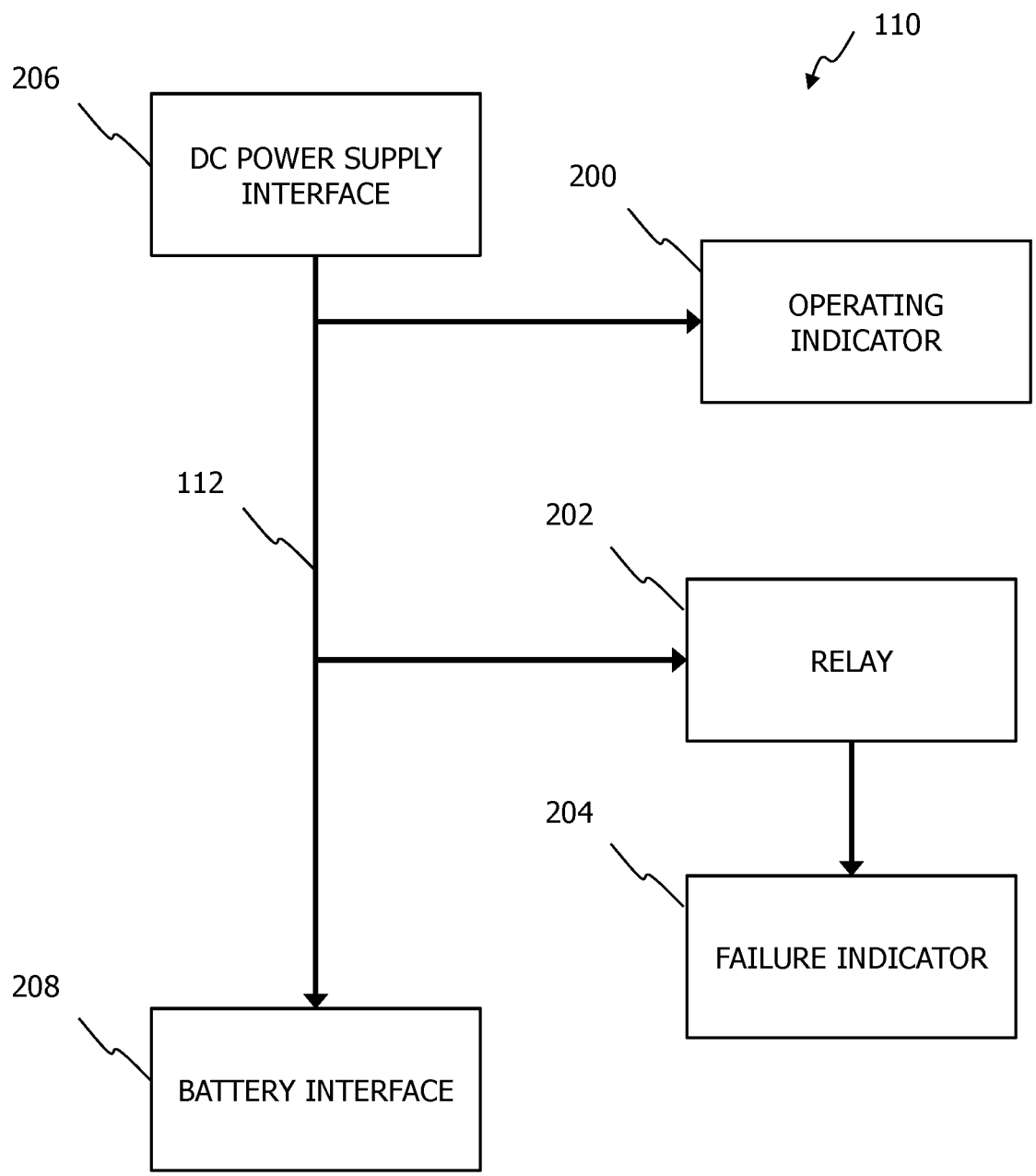
FIG. 2 is block diagram of an example status monitor circuit for use in the electrical system shown in FIG. 1.

FIG. 2 is a block diagram of status monitor circuit 110 shown in FIG. 1. Status monitor circuit 110 includes an operating indicator 200, a relay 202, a failure indicator 204, a DC power supply interface 206, and a battery interface 208. DC bus 112 passes through status monitor circuit 110 and extends from DC power supply interface 206 to battery interface 208. A DC voltage is received at DC power supply interface 206, which may include one or more connectors, contacts, terminals, or other suitable connection devices. Generally, the DC voltage is supplied to battery interface 208, which may also include one or more connectors, contacts, terminals, or other suitable connection devices.

Operating indicator 200 is coupled to DC bus 112 and is configured to activate when the DC voltage on DC bus 112 exceeds an operating threshold. For example, an operating threshold of 12 volts may be set such that operating indicator 200 activates when the DC voltage on DC bus 112 exceeds 12 volts DC (VDC). Operating indicator 200 may include, for example, one or more LED, lamp, beacon, buzzer, alarm, or any other suitable visual, audible, haptic, or otherwise user-detectable indication the DC voltage supplied by DC power supply 108 (shown in FIG. 1) is above the operating threshold.

Relay 202 is coupled to DC bus 112 and detects the DC voltage. When the DC voltage on DC bus 112 falls below a failure threshold, relay 202 activates failure indicator 204. Relay 202 and failure indicator 204 form a failure indicator circuit. Failure indicator 204 may include, for example, one or more LED, lamp, beacon, buzzer, alarm, or any other suitable visual, audible, haptic, or otherwise user-detectable indication the DC voltage on DC bus 112 is below the failure threshold. When activated, failure indicator 204 is supplied DC power from battery 102 (not shown) through relay 202.

Relay 202 includes a normally-closed circuit that is configured to be opened during normal operation when the DC voltage on DC bus 112 is above the failure threshold, and closed when the DC voltage falls below the failure threshold voltage. Relay 202 may include an electromechanical relay, solid-state relay, power semiconductor, or any other suitable device for switching the DC power supplied by battery 102.

Figure 3:
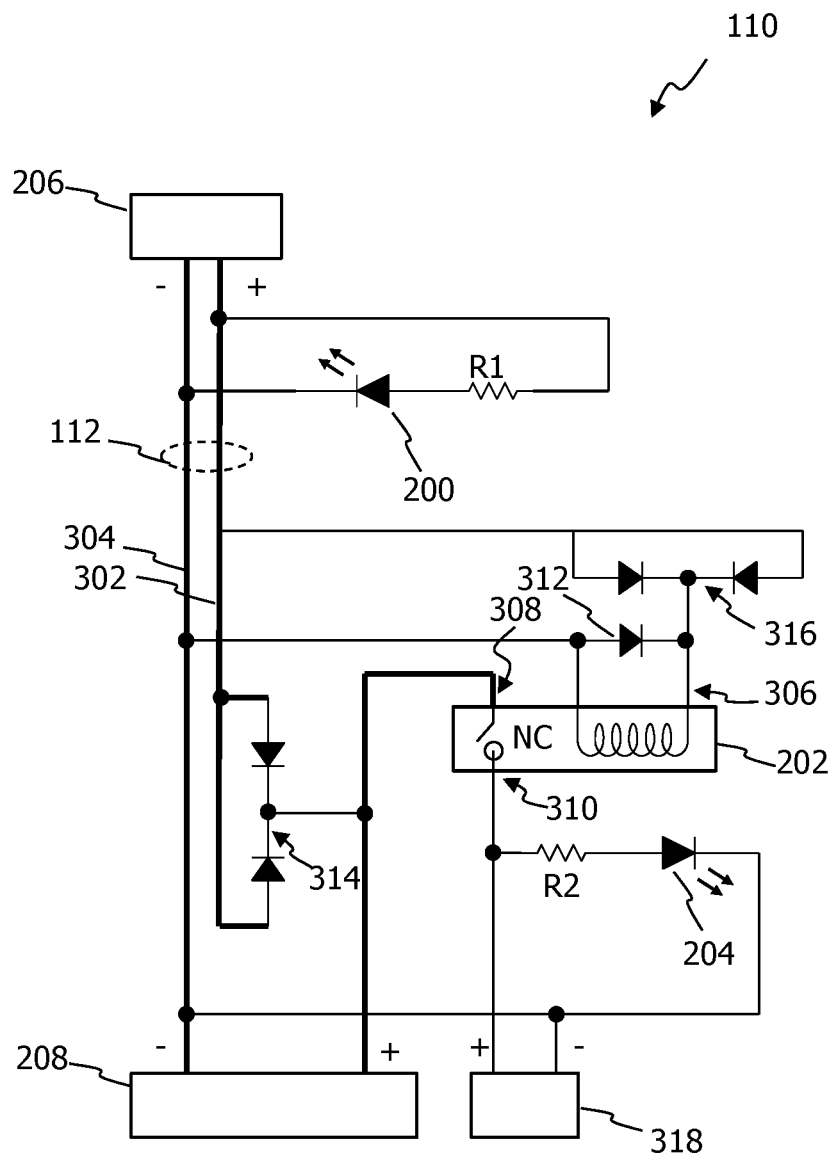
FIG. 3 is a schematic diagram of the status monitor circuit shown in FIGS. 1 and 2.

FIG. 3 is a schematic diagram of status monitor circuit 110 shown in FIGS. 1 and 2. Status monitor circuit includes DC bus 112 connected, or coupled, between DC power supply interface 206 and battery interface 208, and therefore between DC power supply 108 and battery 102. DC bus 112 includes a positive line 302 and a negative line 304. Status monitor circuit 110 includes operating indicator 200 coupled to DC bus 112, or across positive line 302 and negative line 304. Operating indicator 200 is illustrated as an LED coupled in series with a resistor R1 and is configured to activate when the DC voltage on DC bus 112, when divided by resistor R1, exceeds the forward voltage of the LED, i.e., indicator 200. More specifically, when AC power source 104 is operating normally and DC power supply 108 is operating normally, operating indicator 200 is activated. When either of AC power source 104 and DC power supply 108 fail, operating indicator 200 is not activated.

Relay 202 is illustrated as an electromechanical relay that includes control terminals 306 across which a voltage is applied to control commutation of a normally-closed circuit between a line terminal 308 and a load terminal 310. Control terminals 306 are connected across an inductive coil of relay 202. When a voltage is applied to control terminals 306, the current conducted by the coil results in an electromotive force that commutates relay 202. When the voltage is applied to control terminals 306, the normally-closed circuit between line terminal 308 and load terminal 310 opens, or breaks, and decouples DC bus 112 from failure indicator 204. When the DC voltage on DC bus 112 falls below the failure threshold, relay 202 commutates back to the normally-closed position and closes, or makes, the circuit between line terminal 308 and load terminal 310, thereby applying the DC voltage from battery 102 to failure indicator 204. Failure indicator 204 is illustrated as an LED in series with a resistor R2.

Status monitor circuit 110 includes a protection diode 312 coupled across control terminals 306 of relay 202, and in parallel with the inductive coil of relay 202. When the DC voltage applied across control terminals 306 is removed, energy in the inductive coil is dissipated as a coil current that "free wheels" through protection diode 312. Protection diode 312 prevents an excessive voltage buildup on control terminals 306 of relay 202.

Status monitor circuit 110 includes a first current blocking circuit 314 coupled in series with DC bus 112 to prevent backflow current conduction from battery 102 to DC power supply 108 and to control terminals 306 of relay 202. First current blocking circuit 314 may include one or more current blocking diodes that enable uni-directional current from DC power supply 108 toward battery 102. First current blocking circuit 314 prevents battery 102 from producing a "false detection" of the DC voltage on DC bus 112 generated by DC power supply 108, thereby enabling failure indicator 204 to be activated appropriately by relay 202.

Status monitor circuit 110 includes a second current blocking circuit 316 coupled in series between DC bus 112 and control terminals 306 of relay 202. Second current blocking circuit 316 prevents backflow current conduction from relay 202 and, more specifically, the inductive coil of relay 202, to DC bus 112.

Status monitor circuit 110 also includes an auxiliary indicator interface 318 coupled in parallel to failure indicator 204. When the DC voltage on DC bus 112 falls below the failure threshold, relay 202 commutates back to the normally-closed position and closes, or makes, the circuit between line terminal 308 and load terminal 310, thereby applying the DC voltage from battery 102 to failure indicator 204 and auxiliary indicator interface 318. Auxiliary indicator interface 318 may include one or more connectors or terminals that enable an external or remote indicator to be connected to status monitor circuit 110. An auxiliary indicator may include, for example, an external light, alarm, beacon, or any other suitable visual, audible, haptic, or otherwise sensory alert to a user. For example, when implemented for railroad crossing equipment, failure indicator 204 may include an LED located local to status monitor circuit 110 or the piece of equipment within which status monitor circuit is located, but otherwise not externally visible or not large enough to sufficiently alert users. In one embodiment, status monitor circuit 110 is implemented within a unit that houses a charging system for a bank of batteries. Consequently, failure indicator 204 may only be visible within that unit, or housing. Auxiliary indicator interface 318 enables the connection and control of another indicator to status monitor circuit 110 that is, for example, mounted externally on the housing. Such an auxiliary indicator may include a large external indicator lamp.

Figure 4:
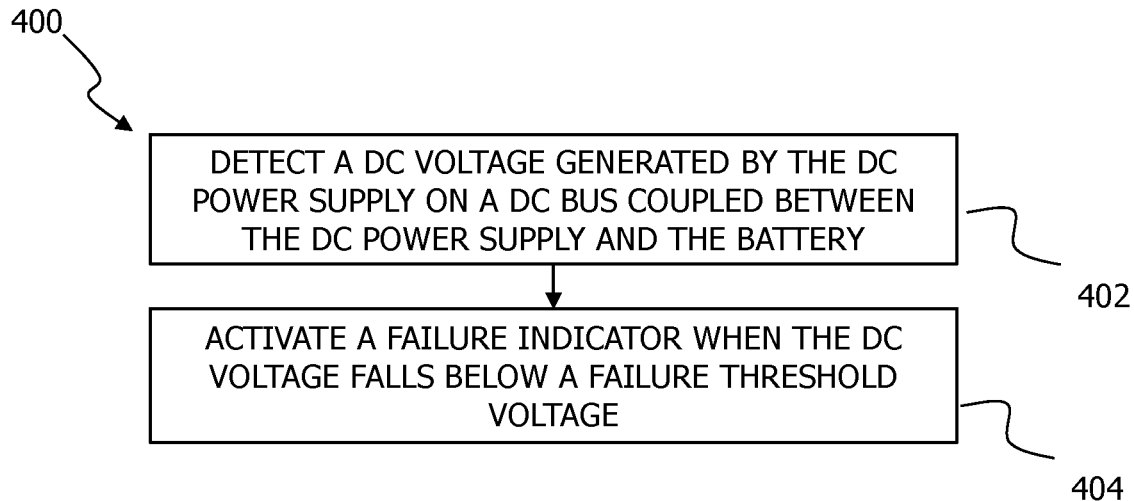
FIG. 4 is a flow diagram of an example method of monitoring a DC power supply for charging a battery.

FIG. 4 is a flow diagram of an example method 400 of detecting the status of a DC power supply for charging a battery, such as DC power supply 108 and battery 102 shown in FIGS. 1 and 2. Referring to FIGS. 1 and 3, method 400 includes detecting 402 a DC voltage generated by DC power supply 108 on DC bus 112. When the DC voltage falls below a failure threshold voltage, relay 202 activates 404 failure indicator 204.

Figure 5:
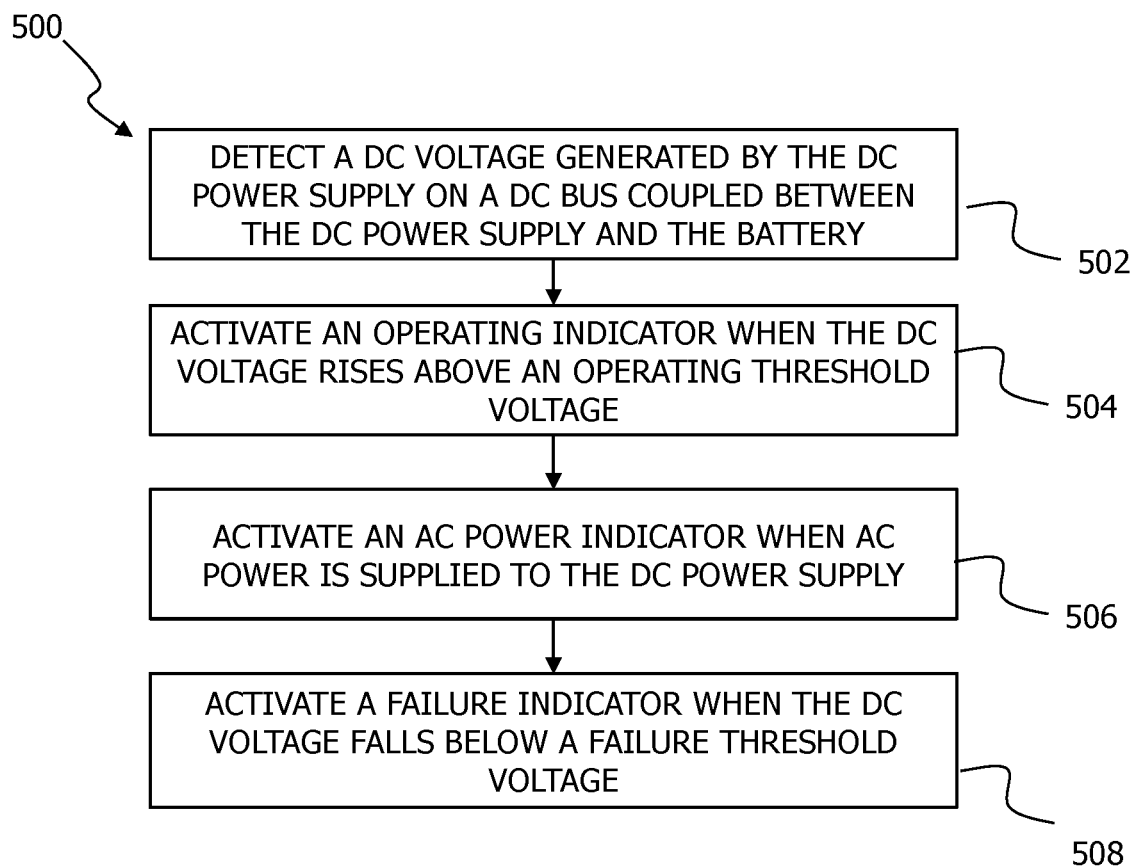
FIG. 5 is a flow diagram of another example method of monitoring a DC power supply for charging a battery.

FIG. 5 is a flow diagram of another example method 500 of detecting the status of DC power supply 108 for charging battery 102. Referring to FIGS. 1-4, method 500 includes detecting 502 the DC voltage generated by DC power supply 108 on DC bus 112. When the DC voltage rises above an operating threshold voltage, operating indicator 200 is activated 504. When AC power source 104 is operating normally and AC power is supplied to DC power supply 108, an AC power indicator (not shown) is activated 506.

When the DC voltage falls below a failure threshold voltage, failure indicator 204 is activated 508. For example, when AC power source 104 is operating normally and the AC power indicator is activated, but DC power supply 108 has failed, failure indicator 204 is activated 508.

The circuits and methods described herein may be implemented using computer programming or engineering techniques including computer software, firmware, hardware or any combination or subset thereof, wherein the technical effect may include at least one of: (a) decreasing the time required to diagnose a power failure; (b) decreasing the time required to diagnose the source of a power failure; (c) more accurately diagnosing the source of a power failure; and (d) improving reliability of backup batteries for electrical systems.

In the foregoing specification and the claims that follow, a number of terms are referenced that have the following meanings.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here, and throughout the specification and claims, range limitations may be combined or interchanged. Such ranges are identified and include all the sub-ranges contained therein unless context or language indicates otherwise.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to provide details on the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A status monitor circuit for detecting a status of a direct current (DC) power supply for charging a battery, the status monitor circuit comprising:
   a DC bus coupled between the DC power supply and the battery; and
   a failure indicator circuit configured to detect a DC voltage generated by the DC power supply on the DC bus, the failure indicator circuit comprising:
      a failure indicator; and
      a relay comprising a closeable relay circuit and a terminal, the relay configured to close the closeable relay circuit to activate the failure indicator when the DC voltage is below a failure threshold voltage at the terminal.

2. The status monitor circuit of claim 1 further comprising an operating indicator circuit comprising a first indicator coupled to the DC bus and configured to activate when the DC voltage rises above an operating threshold voltage.

3. The status monitor circuit of claim 1 further comprising an alternating current (AC) power indicator configured to activate when AC power is supplied to the DC power supply.

4. The status monitor circuit of claim 1 further comprising a first current blocking circuit, coupled in series with the DC bus and configured to prevent backflow current from the battery to the DC power supply.

5. The status monitor circuit of claim 4, wherein the relay comprises a normally closed relay circuit, the normally closed relay circuit comprising the closeable relay circuit, the normally closed relay circuit comprising:
   a control terminal comprising the terminal, the control terminal coupled to the DC bus between the first current blocking circuit and the DC power supply;
   a line terminal coupled to the DC bus between the first current blocking circuit and the battery; and
   a load terminal coupled to the failure indicator.

6. The status monitor circuit of claim 5 further comprising a second current blocking circuit coupled between the DC bus and the control terminal of the relay and configured to prevent backflow current from the relay to the DC power supply.

7. The status monitor circuit of claim 4, wherein the first current blocking circuit is further configured to prevent backflow current from the battery to the relay.

8. A method of detecting a status of a direct current (DC) power supply for charging a battery, the method comprising:
   detecting, by a relay comprising a closeable relay circuit and a terminal, a DC voltage generated by the DC power supply on a DC bus coupled between the DC power supply and the battery; and
   activating, by the relay configured to close the closeable relay circuit, a failure indicator when the DC voltage falls below a failure threshold voltage at the terminal.

9. The method of claim 8 further comprising activating an operating indicator when the DC voltage generated by the DC power supply on the DC bus rises above an operating threshold voltage.

10. The method of claim 8 further comprising activating an AC power indicator when AC power is supplied to the DC power supply.

11. The method of claim 8 further comprising blocking, at a first current blocking circuit, current flow from the battery to the DC power supply and to the relay.

12. The method of claim 11 wherein detecting the DC voltage generated by the DC power supply comprises receiving the DC voltage at a control terminal of the relay, the control terminal comprising the terminal, the control terminal coupled between the first current blocking circuit and the DC power supply.

13. The method of claim 12, wherein activating the failure indicator comprises closing a normally closed circuit of the relay to conduct current from the battery to the failure indicator when the DC voltage received at the control terminal falls below the failure threshold voltage, wherein the normally closed circuit of the relay comprises the closeable relay circuit.

14. The method of claim 13 further comprising blocking, at a second blocking circuit, backflow current from the relay to the DC power supply.

15. An electrical system comprising:
   a direct current (DC) power supply configured to be coupled to an alternating current (AC) power source and to generate a DC voltage;
   a battery;
   a DC bus coupled between the DC power supply and the battery; and
   a failure indicator circuit configured to detect the DC voltage generated by the DC power supply on the DC bus, the failure indicator circuit comprising:
      a failure indicator; and
      a relay comprising a closeable relay circuit and a terminal, the relay configured to close the closeable relay circuit to activate the failure indicator when the DC voltage is below a failure threshold voltage at the terminal.

16. The electrical system of claim 15 further comprising an operating indicator comprising a first indicator coupled to the DC bus and configured to activate when the DC voltage rises above an operating threshold voltage.

17. The electrical system of claim 15 further comprising an AC power indicator configured to be coupled to the AC power source and to activate when AC power is supplied to the DC power supply.

18. The electrical system of claim 15 further comprising a first current blocking circuit configured to prevent backflow current from the battery to the DC power supply and the relay.

19. The electrical system of claim 18, wherein the relay comprises a normally closed relay system, the normally closed relay system comprising the closeable relay circuit, the normally closed relay system comprising:
   a control terminal comprising the terminal, the control terminal between the first current blocking circuit and the DC power supply;
   a line terminal between the first current blocking circuit and the battery; and
   a load terminal.

20. The electrical system of claim 15 further comprising a second current blocking circuit configured to prevent backflow current from the relay to the DC power supply.

* * * * *